United States Patent [19]

Parthasarathi

[11] Patent Number: 4,997,517

[45] Date of Patent: Mar. 5, 1991

[54] MULTI-METAL LAYER INTERCONNECT TAPE FOR TAPE AUTOMATED BONDING

[75] Inventor: Arvind Parthasarathi, North Branford, Conn.

[73] Assignee: Olin Corporation, New Haven, Conn.

[21] Appl. No.: 462,519

[22] Filed: Jan. 9, 1990

[51] Int. Cl.[5] .................. B44C 1/22; C23F 1/02; C03C 15/00; C03C 25/06

[52] U.S. Cl. .................. 156/630; 29/827; 156/634; 156/644; 156/656; 156/659.1; 156/901; 437/220

[58] Field of Search ............ 156/629, 630, 634, 644, 156/656, 659.1, 666, 901, 902; 29/827, 846, 852; 427/97; 174/68.5, 52.1; 204/15, 24, 32.1; 361/404–408, 821; 437/220, 228

[56] References Cited

U.S. PATENT DOCUMENTS

| | | | |
|---|---|---|---|
| 3,480,836 | 8/1966 | Aronstein | 156/630 X |
| 3,768,986 | 10/1973 | Ramos et al. | 174/52.1 X |
| 3,773,628 | 11/1973 | Misawa et al. | 204/15 |
| 4,607,276 | 8/1986 | Butt | 357/79 |
| 4,619,741 | 10/1986 | Minten et al. | 204/15 |
| 4,634,631 | 1/1987 | Gazit et al. | 428/421 |
| 4,642,160 | 2/1987 | Burgess | 156/630 |
| 4,647,508 | 3/1987 | Gazit et al. | 428/421 |
| 4,721,993 | 1/1988 | Walter | 357/70 |
| 4,736,236 | 4/1988 | Butt | 357/70 |
| 4,801,999 | 1/1989 | Hayward et al. | 357/70 |
| 4,806,409 | 2/1989 | Walter et al. | 428/138 |
| 4,814,855 | 3/1989 | Hodgson et al. | 174/52.4 |
| 4,827,376 | 5/1989 | Voss | 361/388 |
| 4,849,857 | 7/1989 | Butt et al. | 361/388 |

OTHER PUBLICATIONS

"TAB Technology Tackles High Density Interconnections" from *PC Technology* (34/Electronic Packaging & Production (Dec. 1984).

"Tape-Automated Bonding Pushes in New Directions" from *Electronics* 10/3/87.

"Tab for High I/O and High Speed" from *Semiconductor International* -Jun. 1988.

*Primary Examiner*—William A. Powell
*Attorney, Agent, or Firm*—Gregory S. Rosenblatt; Paul Weinstein

[57] ABSTRACT

A multi-metal layer interconnect tape is provided. The tape is not supported by a dielectric carrier. A thin dielectric adhesive layer separates at least two self supporting metal foil layers. In one embodiment of the invention, conductive vias electrically interconnect leads formed in a first metal foil layer with ground and power circuits formed in a second metal foil layer. The metal foil layers are in close proximity so the vias have a low aspect ratio. The vias may be readily coated with continuous film of a conductive metal and are much easier to clean than conventional vias having significantly higher aspect ratios.

18 Claims, 2 Drawing Sheets

MULTI-METAL LAYER INTERCONNECT TAPE FOR TAPE AUTOMATED BONDING

While the invention is subject to a wide range of applications, it is especially suited for interconnect circuits having a plurality of conductive planes separated by a dielectric. More particularly, the invention relates to multi-metal layer tape automated bonding (TAB) interconnect circuit assemblies having a ground plane and a signal plane separated by a dielectric adhesive layer.

Electronic packages for housing microelectronic devices, such as silicon based semiconductor integrated circuits, may comprise a housing formed by bonding a base component to a cover component. A cavity is formed within the housing to encase the device. An electrically conductive leadframe passes through the housing so that power and electrical signals may be transmitted between the device and external circuitry. Alternatively, a plastic resin may be molded around the device and a portion of the leadframe to form the housing.

Thin bond wire electrically interconnect the integrated circuit device to the leadframe. These wires are typically on the order of about 1 mil in diameter. They are manufactured from gold, aluminum, copper or alloys of the metals. The wires are bonded to small bonding pads on the surface of the device by a process such as ultrasonic bonding or thermocompression bonding. As the integrated circuit devices become more complex and require an increasing number of interconnections between the device and external circuitry, limitations with conventional wire bonding have developed. The limitations include both lead density and electrical performance. Gold ball wire bonds require approximately a 3 mil by 3 mil bonding pad with 6 mil spacing between bonding pad center lines. The round, irregular spaced bond wires introduce large lead inductances and lead-to-lead capacitance, resulting in propagation delay and signal distortion which becomes especially acute at signal frequencies above about 50 MHz.

A solution to the limitations with bond wires is the use of TAB leads. TAB utilizes a metal tape which is usually a wrought or electrodeposited copper or copper base alloy. The metal tape may be plated with a second metal such as gold, nickel or tin to facilitate soldering and bonding to the integrated circuit device. The tape is formed into a plurality of individual sites. Each site defines a plurality of narrow leads arranged to extend outwardly from the integrated circuit device. The inner lead portions are bonded to the bonding pads of the device and the outer lead portions are bonded to a leadframe, a circuit board, or other external circuitry.

TAB is particularly suited for high density electronic circuits. TAB leads are routinely bonded to 2 mil by 2 mil bonding pads with 4 mil center lines. The leads are generally shorter than conventional wire bonds, have a larger cross-sectional area and are more uniformly spaced than the wire bonds. As a result, the electrical performance of TAB leads is superior in high speed applications.

A more detailed review of the performance of TAB leads as compared to conventional wire bonding may be found in "TAB TECHNOLOGY TACKLES HIGH DENSITY INTERCONNECTIONS" by Dickson, "TAPE-AUTOMATED BONDING PUSHES IN NEW DIRECTIONS" by Eleccion, and "TAB FOR I/O AND HIGH SPEED" By Burggraaf, all of which are incorporated herein by reference.

Single metal layer TAB tapes take one of three forms. The first is a single layer or all metal construction. The second is a two-layer construction, comprising a metal layer supported by a dielectric backing layer. The third is a three-layer construction, comprising a metal layer adhesively bonded to a dielectric support layer. The dielectric support layer may be any dielectric with suitable electrical and mechanical properties. One exemplary dielectric material is a polyimide known as KAPTON, which is manufactured by DuPont. The thickness of the dielectric support layer ranges from about 2 mils up to about 5 mils.

The metal foil layer is usually copper or a dilute copper alloy. The foil layers are quite thin. To transmit sufficient current through the leads, electrical conductivity must be high. Generally, a conductivity of about 100 percent IACS ("IACS" stands for International Annealed Copper Standard. A value of 100% is assigned to "pure" copper) is required. The copper foil layer is from about one half to about 6 mils in thickness. Usually the foil layer is from about 0.0007 inches (known in the art as one half ounce copper) to about 0.0028 inches (2 ounce copper). Leads are patterned in the foil by a photolithographic technique. Lead widths as thin as about 2 mils are commercially produced. A 2 mil by 2 mil lead cross-section is quite typical. A general review of TAB technology is disclosed in the above referenced article by Dickson.

Improved electrical performance is obtained by providing a TAB leadframe having a plurality of metal layers arranged in generally parallel planes. In a two metal layer construction, commonly referred to as G-TAB, the first metal layer is patterned into leads The leads are dedicated to transmitting electrical signals to and from the device This layer is commonly referred to as the "signal plane". The second metal layer is patterned into a plurality of circuits to supply a ground and power source for the device The second metal layer is known as the "ground plane".

The two metal layer circuit is conventionally fabricated from either the two or three layer single metal TAB leadframe. The two metal layer circuit may comprise two conductive layers bonded directly to a dielectric layer or two conductive layers adhesively bonded to a dielectric layer. U.S. Pat. Nos. 4,634,631 and 4,647,508 disclose multiple metal layer flexible circuits having an adhesive layer to bond both metal layers to a dielectric carrier.

It is desirable that all inner leads be on the same horizontal level to permit rapid bonding to the integrated circuit device. Conductive vias may be provided to electrically interconnect the ground plane and the signal plane. Ground and power signals are then transmitted to inner leads on the signal plane. U.S. Pat. No. 4,801,999 to Hayward et al. discloses crossover leads. Crossover leads are extended length leads which are nonplanar and extend from one metal plane to the other. U.S. Pat. No. 4,814,855 to Hodgson et al. discloses a plurality of metal layers separated from sheets of polyimide film. Holes are opened in the polyimide at the position where vias are desired. Copper leads overlying the holes are formed into balls. The balls are interconnected by thermocompression bonding.

Laser vaporization of an epoxy based dielectric material using the overlying copper foil layers as a mask is disclosed in U.S. Pat. No. 4,642,160 to Burgess. The non-conductive via is made electrically conductive by the electroless deposition of a metal such as copper.

While the electrical performance of the two metal layer TAB tape is superior to both single metal layer TAB tape and conventional bond wires, assembly is difficult. Both the three layer multi-metal tape metal/polyimide/metal) and five layer multi-metal tape (metal/adhesive polyimide/adhesive metal) require considerably more processing steps than single metal layer TAB constructions. The multi-metal layer structures are essentially two single metal layer TAB interconnect tapes bonded together. Additional assembly steps and precise alignment of the multiplicity of layers is required.

The polyimide support layer is from about 1 mil to about 2 mils thick. The conductive vias have a diameter sufficiently narrow to interconnect to a single signal plane circuit trace (about 3 to about 5 mils) and a depth equal to the thickness of the ground plane layer, polyimide and adhesive layers (about 1.4 mils + 1.2 mils + 1.0 mils = 3.6 mils). The aspect ratio of the via is therefore quite high, on the order of about 1.2. The aspect ratio is defined as the ratio of depth of the via to its diameter The vias are made conductive by the deposition of a conductive material, either by electrolytic or electroless means. The higher the aspect ratio, the more difficult it is to deposit conductive material within the hole. Also, a large aspect ratio increases the difficulty of cleaning of the holes to remove residual dielectric or chemical salts.

Accordingly, it is an object of the invention to provide a multi-metal interconnect tape with a reduced aspect ratio. It is a feature of the invention that the metal layers are separated only by a dielectric adhesive. It is an advantage of the invention that the adhesive has a thickness of less than about 0.002 inches. It is a further advantage of the invention that the ground plane supplies sufficient support to eliminate the requirement of a dielectric carrier layer. It is another feature of the invention that the multi-metal TAB tape so produced may function as a substitute for polyimide supported TAB single metal layer tapes. It is a further advantage of the invention that the number of processing steps to manufacture the multi-metal layer tape is reduced yet another advantage of the invention is the TAB tapes produced may have improved electrical characteristics over conventional multi-layer TAB tape. Still another advantage of the invention is that electrical properties may be adjusted by varying the adhesive thickness yet another advantage of the invention is that rigidity of the multi-metal layer TAB interconnect tape may be varied by adjusting the composition and thickness of the metal foil layers.

In accordance with the invention, there is provided an interconnect tape for electrically connecting an integrated circuit device to external circuitry. The tape comprises a first metal foil layer patterned into a plurality of leads and a second metal foil layer which contains at least one personality window and an indexing means. Disposed between the two metal foil layers is a dielectric adhesive. The dielectric adhesive is at least thick enough to be effective to prevent current leakage between the first and second metal foil layers.

These and other objects, features and advantages of the invention will become more apparent from the specification and drawings which follow in which like elements have been given like reference numbers and in which prime numbers identify similar elements providing similar functions.

Figure 1:
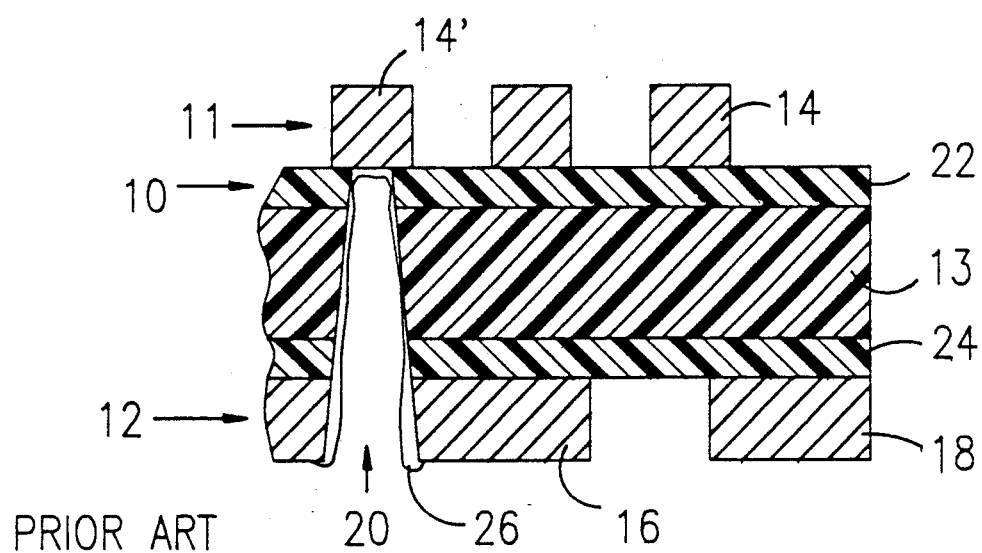
FIG. 1 shows in cross-sectional representation a dielectric supported two metal layer interconnect tape as known in the prior art.

FIG. 1 shows in cross-sectional representation a dielectric supported two-metal layer interconnect tape 10 as known from the prior art. The interconnect tape 10 includes first 11 and second 12 generally parallel metal layers supported by a dielectric support layer 13. The first metal layer 11 is formed into a plurality of leads 14 by conventional photolithographic techniques. Briefly, this process entails applying a photosensitive resist over the foil. A mask defining the desired circuit pattern is placed over the resist. A light source exposes those areas not shielded by the mask. The photoresist polymerizes in the exposed regions becoming resistant to a first solvent. The photoresist which did not polymerize is removed by dissolution in the first solvent. The exposed metal foil is then etched using a suitable acid or combination of acids to expose the underlying carrier layer.

After rinsing the acid etchant, a second solvent removes the polymerized resist by dissolution leaving metal circuit traces in the desired lead pattern supported by the carrier layer. The photolithographic process may use either a positive or a negative photoresist as known in the art.

The signal leads 14 transmit electrical signals from the integrated circuit device (not shown) to external circuitry. Power and ground leads are electrically connected to the second metal layer 12 and provide power and a ground to the device. The second metal layer 12 is patterned into power circuits 16 and ground circuits 18. The power 16 and ground 18 circuits are electrically interconnected to leads 14' by conductive vias 20.

The interconnect tape 10 also includes a first adhesive layer 22 and a second adhesive layer 24. The interconnect tape 10 comprises a five layer multi-metal layer tape as described above. A three layer multi-metal layer tape would appear similar to that illustrated in FIG. 1 except the first and second adhesive layers would be omitted.

The leads 14, 14', power circuits 16 and ground circuits 18 are formed from a highly conductive material such as copper or a dilute copper base alloy. High conductivity, on the order of 100% IACS, is required for the first metal layer 11. The leads 14 have a small cross-sectional area, on the order of about 0.0014 inches by about 0.002 inches. The ground and power circuits are comparatively wider and may comprise any width up to the entire width of the interconnect tape. The conductivity requirement of the second metal layer 12 is not as stringent as that of the first metal layer 11.

The dielectric support layer 13 is usually a flexible polymer such as a polyimide. The thickness of the support layer is from about 0.001 inches to about 0.002 inches.

The first 22 and second 24 adhesive layers bond the first 11 and second 12 metal layers to the polyimide support layer 13 through a lamination process. The first and second metal layers are laminated to the polyimide at the same time, or in separate operations. The first 22 and second 24 adhesive layers, generally comprise an adhesive such as an epoxy. One suitable adhesive is R8970 manufactured by Rogers Corporation, Chandler, Ariz. The thickness of the first adhesive layer 22 and second adhesive layer 24, is generally on the order of about 0.0005 inches to about 0.001 inches.

The components of the prior art interconnect tape 10, are drawn approximately to scale. The thickness of the leads 14 14', power circuits 16 and ground circuits 18 are all on the order of about 0.0014 inches. The first 22 and second 24 adhesive layers are both from about 0.0005 to 0.001 inches thick The polyimide support layer 13 is from about 0.001 to 0.002 inches thick. Conductive vias 20 electrically interconnect the leads 14' to the power 16 and ground 18 circuits.

The combined thicknesses of the dielectric support layer 13 and adhesive layers 22 and 24 result in a high aspect ratio. Deposition of a conductive metal layer 26 within the via is difficult. The narrow hole restricts solution flow. Solution depletion and poor metal coverage within the via results and electrical continuity may be lost.

Figure 2:
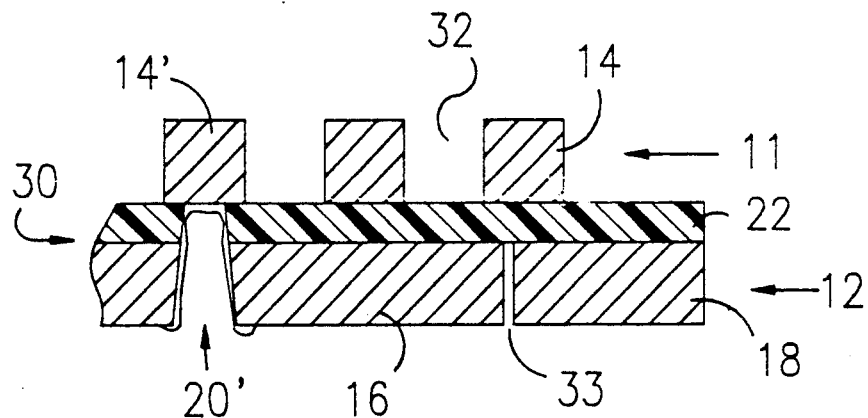
FIG. 2 shows in cross-sectional representation an unsupported two metal layer interconnect tape in accordance with the invention.

The aspect ratio problem of the prior art interconnect tape 10 is solved with the multi-metal layer tape 30 of the invention as illustrated in cross-sectional representation in FIG. 2. The multi-metal layer interconnect tape 30 comprises first 11 and second 12 parallel metal layers. The first metal layer 11 is patterned into a plurality of signal plane leads 14 and ground and power leads 14'. The second metal layer 12 is patterned into power circuits 16 and ground circuits 18. Disposed between the first and second metal layers is a first adhesive layer 22. The thickness of the adhesive layer 22 may vary. At a minimum, the thickness should be sufficient to prevent electrical current leakage between the first and second metal layers. The adhesive layer 22 does not contribute significantly to the overall stiffness of the multi-metal layer tape 30. Accordingly, unlike the prior art dielectric supported tapes, dielectric strength is not a factor.

The thickness of the single adhesive layer 22 may be maintained to a tight tolerance. By proper thickness control, specific electrical properties may be obtained. Decreasing the separation between the first and second metal layers by decreasing adhesive thickness increases the capacitance between the layers. This in turn affects the impedance which is a factor of lead geometry and capacitance. By varying the adhesive layer thickness, signal line impedance can be tailored to improve the electrical performance of the interconnect tape. This tight control of dielectric thickness and electrical properties is not as readily available with conventional dielectric supported tapes as the dielectric thickness must be at least sufficiently thick to support the tape.

For most applications, the adhesive layer 22 thickness is from about 0.00025 inches to about 0.002 inches. More preferably, the adhesive thickness is from about 0.0005 inches to about 0.001 inches.

A suitable polymer dielectric adhesive is characterized by a relatively high resistivity, preferably above about $10^{10}$ ohm-cm. The adhesive should also be chemically compatible with the first and second metal foil layers. The adhesive should also be thermally stable at the temperatures the electronic package will be exposed to. These temperatures may exceed 150°. One group of suitable adhesives are thermosetting epoxy resins A most preferred adhesive is a modified epoxy, phenolic butyral.

The adhesive may be provided as a dry film or as a viscous liquid. The liquid form is screened or sprayed on the surface of the second metal foil layer as described hereinbelow. The thickness of either the dried film or the liquid adhesive is tightly controllable resulting in desired electrical characteristics.

The thickness of the adhesive layer is typically less than about 1 mil. The prior art dielectric has a thickness on the order of 5 mils to about 7 mils. By using the interconnect tape 30 of the invention, the aspect ratio is reduced from over 1 to under about ½. As a result, the via 20' is more easily coated with a conductive metal. The hole is also much easier to clean. Also, since the distance between the first 11 and second 12 metal layers is significantly reduced, alignment between the layers is not as critical.

Structural support for the multi-metal layer tape 30 comes predominately from the first and second metal layers. Design limitations are imposed when forming a pattern for the signal plane leads 14, 14' and the ground 16 and power 18 circuits. The spaces 32 formed in the first metal layer 11 preferably do not align with spaces 33 formed in the second metal layer 12. The thin adhesive layer 22 provides minimal support. If the spaces 32, 33 align only the adhesive layer 22 supports the tape at that location and the tape is at risk for possible breakage or undue flexure. However, since the ground 16 and power 18 circuits are often quite wide and may comprise the entire second metal layer 12, the design restriction is not overly burdensome.

Figure 3:
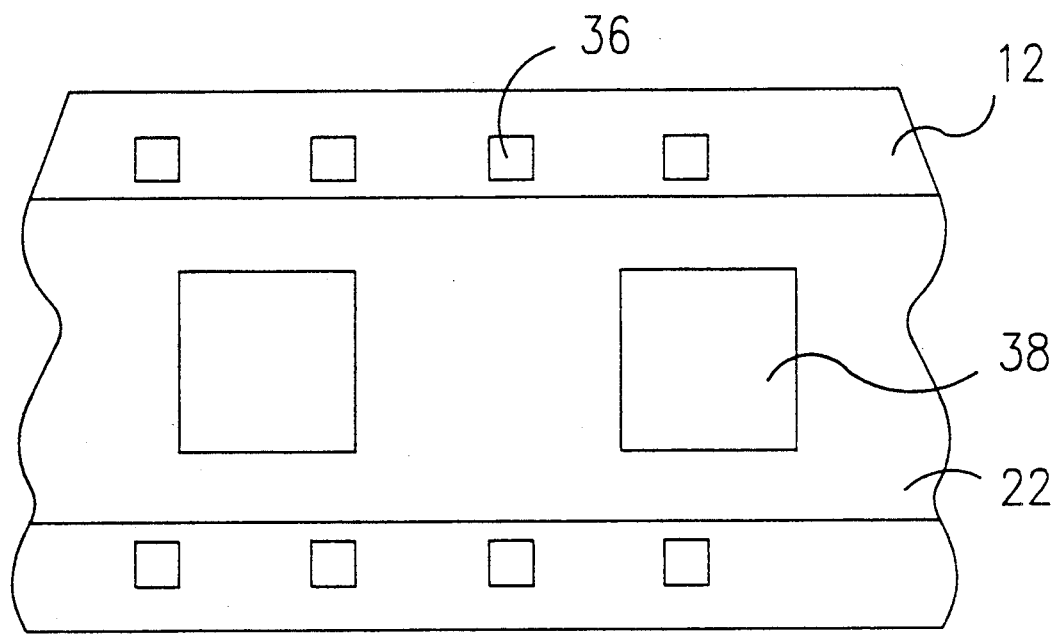
FIG. 3 shows in top planar view the ground plane and adhesive layer of the interconnect tape of the invention prior to circuit patterning.
Figure 4:
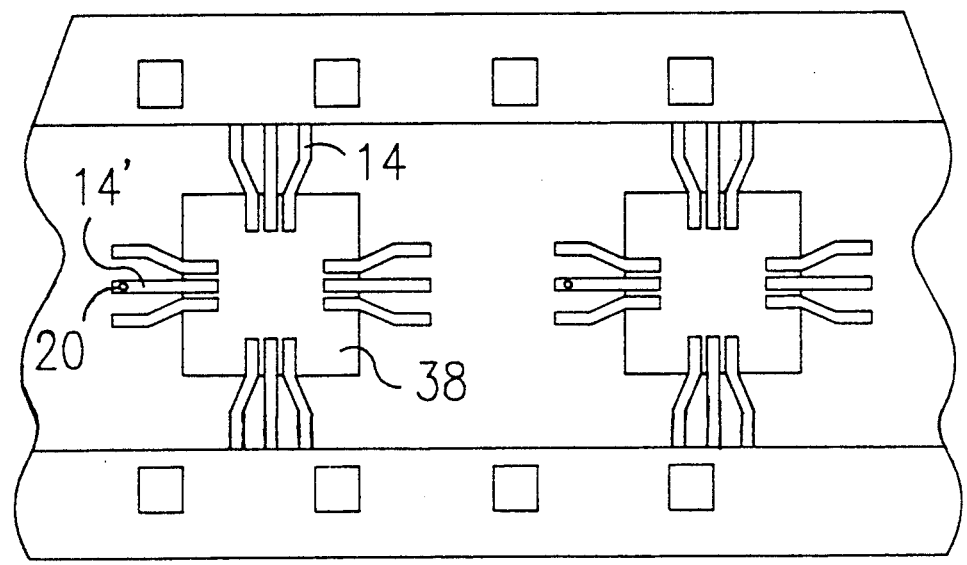
FIG. 4 shows in top planar view the interconnect tape of FIG. 3 following lamination of the signal plane and photopatterning of circuit traces.

FIGS. 3 and 4 illustrate in top planar view an assembly process for the multi-metal layer interconnect tape of the invention. With reference to FIG. 3, the second metal foil layer 12, which may be subsequently patterned into ground and power circuits, is provided. The thickness of the second metal layer is from about 0.0005 inches to about 0.006 inches. More preferably, thickness of the second metal layer 12 is from about 0.0014 inches to about 0.0028 inches. The ground and power circuits which may be subsequently formed in the second metal layer 12, are generally wider than the signal plane leads. The thickness of second metal layer 12 is generally equal to or thinner than the thickness of the first metal layer. The cross-sectional area of the circuit traces formed from the second metal layer are larger than the cross sectional area of the signal plane leads. The conductivity requirement of the second metal layer 12 is not as rigorous as the conductivity requirements of the first metal layer.

While the second metal layer 12 may be copper or a high electrical conductivity dilute copper alloy, such as used for the signal plane traces, it is preferred to use a higher strength copper alloy. If the electrical current to be carried by the power and ground circuits are not unduly high or if the cross-sectional area of the circuits is large, other less conductive metals may be used. Nickel, nickel alloys and copper-nickel alloys are all suitable for the second metal layer 12 under these conditions. Preferably, the tensile strength of the second metal layer 12 is above about 50 ksi. Among the high conductivity copper alloys preferred are copper alloy C194 (nominal composition 97.0% copper, 2.1%–2.6% iron, 0.015–0.15% phosphorous, 0.05–0.020% zinc, and up to 0.03% lead), copper alloy C195 (nominal composition 96.0% copper, 1.3–1.8% iron, 0.08–0.012% phosphorous 0.040–0.7% tin, up to 0.02% aluminum, up to 0.02% lead, and up to 0.20% zinc.) A most preferred alloy for the second metal layer 12 is copper alloy C1094 (nominal composition 99.90% copper, 0.085 minimum percent silver and a maximum of 0.02% oxygen) which has an electrical conductivity about equal to pure copper and a tensile strength of about 77 ksi.

The tensile strength of a conventional polyimide support layer is about 33 ksi. By proper selection of the second metal layer 12 composition, temper and thickness, the tensile strength of the multi-metal layer tape of the invention may be controlled. The tensile strength may be fashioned to be equal to that of conventional interconnect tape or the tensile strength can be higher or lower as desired.

The adhesive layer 22 is tacked to the second metal layer 12. The adhesive layer may comprise a dry film laminated into place. "Tack" is used in its conventional sense in the art, namely, to attach without completely curing The tack temperature causes the adhesive to adhere without initiating a complete cure reaction.

Alternatively, the adhesive layer 22 may be applied in the form of a liquid adhesive which is applied by screen printing or spraying. To facilitate deposition and thickness control, the liquid adhesive may be diluted in a suitable solvent. Regardless how the adhesive is applied, the thickness is at least that effective to prevent current leakage between the first and second metal layers. The adhesive thickness is also dependent on the desired electrical properties of the multi-metal interconnect tape as discussed above. The thickness regulates capacitance and maximum signal speed. Typically, the thickness of the adhesive layer 22 will be less than about 0.002 inches thick. For most circuits, from about 0.0005 inches to about 0.001 inch is preferred. The adhesive 22 is the same width as the second metal foil layer 12 or narrower. A more narrow adhesive width as illustrated in FIG. 3 avoids adhesive in the region of the sprocket hole indexing means.

After tacking of the adhesive layer 22, features are formed in the second metal layer 12 and adhesive layer 22. These features generally include an indexing means, such as sprocket holes 36 to permit automated alignment of the TAB leads. Preferably, the sprocket holes or other indexing means are formed on a portion of the second metal layer 12 which is not covered by the adhesive layer 22. The features may be formed by any suitable process. Stamping is preferred over etching due to the disparate chemical properties of the adhesive and metal foil layer.

A personality window 38 is formed in both the second metal layer 12 and adhesive layer 22. Usually, a plurality of personality windows corresponding to a plurality of interconnect sites are formed along the length of the metal foil tape. The personality window 38 is centrally positioned on the interconnect tape and provides an aperture for the placement of the electronic device.

Once the features have been formed in the second metal layer 12 and adhesive layer 22, the first metal layer is bonded to the adhesive 22. The width of the first metal layer is approximately equal to the width of the adhesive. Bonding is typically by lamination. For a tacked epoxy, a lamination cycle which will fully cure the epoxy and bond it to the first and second metal layers comprises heating to from about 200° C. to about 400° C. under a pressure of from about 50 psi to about 250 psi.

Following bonding, circuit traces are formed in the first and second metal layers by photolithographic techniques as described above. The signal plane leads 14 and the ground and power circuits may be formed at the same time or during separate process steps. The second metal layer need not be patterned and may constitute a continuous ground plane.

As illustrated in FIG. 4, the first metal foil layer is patterned into a plurality of signal leads 14 disposed about the personality window 38. The leads 14 extend in cantilever fashion into the personality window for electrical interconnection to the integrated circuit device. Conductive vias 20 (shown in phantom in FIG. 4) electrically interconnect the second metal layer to power and ground leads 14'. Since the aspect ratio of the via is relatively small, solution transfer within the via is not impeded. Means used to make the relatively large vias found on printed circuit boards may be employed. For example, a layer of copper may be deposited by electroless plating.

Another method of making the vias electrically conductive is known as the BLACKHOLE TM preplating process (BLACKHOLE TM is a trademark of Olin Corporation, Stamford, Conn.). A carbon black dispersion is deposited on the walls of the non-conductive vias. A conductive metal is then deposited on the carbon black dispersion by electrolytic means. Preferably, the deposited metal is copper to maximize electrical conductivity. This process is detailed in U.S. Pat. No. 4,619,741 to Minten et al. which is incorporated herein by reference.

Figure 5:
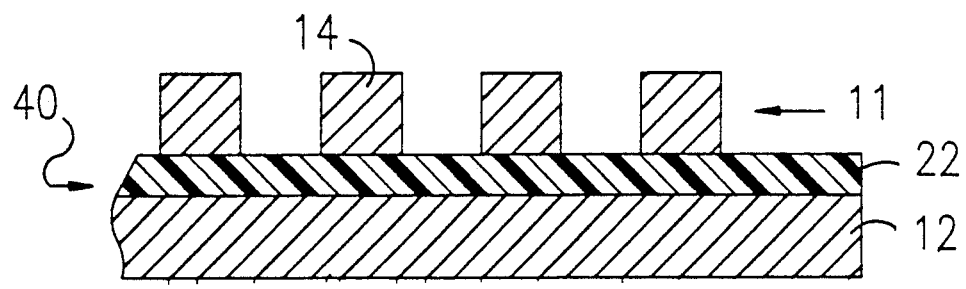

While the multi-metal interconnect tape of the invention has been described in terms of separate signal and ground planes, the invention is equally applicable to an interconnect tape 40 having only one electrically active plane as illustrated in FIG. 5. In this embodiment, all leads 14 are formed in the first metal layer 11. The second metal layer 12 includes an indexing means and personality window However, the second metal layer is not electrically connected to the device and is primarily a carrier or support layer No conductive vias are required and the adhesive layer 22 effectively isolates the electrically active first layer 11 from the carrier layer. This embodiment forms an improved version of the polyimide supported three layer single metal tape of the prior art. The second metal layer may be any metal having suitable flexibility for use in an interconnect tape. By selecting an appropriate alloy, such as copper alloy C1094, the yield strength of the interconnect tape 40 is superior to that achievable with a polyimide support layer.

It may be desirable to ground the second metal layer either to body of the electronic package if metal electronic package is employed or to the external circuitry. Grounding will prevent unpredictable electrical effects due to charging of the support layer.

While the invention has been particularly described in terms of two metal layer interconnect tapes, additional metal layers may be bonded to the tape and formed into additional circuit patterns. Accordingly, such circuit structures having more than two metal layers also fall within the broad scope of the invention.

The patents, patent applications and publications set forth in this application are incorporated by reference herein.

It is apparent that there has been provided, in accordance with this invention, a multi-metal layer interconnect tape which fully satisfies the objects, means and advantages set forth herein above. While the invention has been described in combination with the embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

What is claimed is:

1. A process for the manufacture of an interconnect tape, comprising the steps of;
   providing first and second metal foil layers;
   forming an indexing means in said second metal foil layer;
   bonding a dielectric adhesive to said second metal foil layer, such that said adhesive does not obstruct said indexing means;
   forming a personality window in said second metal foil layer and said dielectric adhesive;
   bonding said first metal foil layer to said dielectric adhesive; and
   patterning said first metal foil layer into a plurality of leads spaced about said personality window, said leads having an inner lead portion extending into said personality window.

2. The process of claim 1 including selecting said first and second metal foil layers to be copper or a copper base alloy.

3. The process of claim 2 wherein said second metal foil layer is selected to have a tensile strength greater than about 33 ksi.

4. The process of claim 2 including the step of patterning said second metal foil layer into ground and power circuits.

5. The process of claim 4 wherein said ground and power circuits are patterned such that the spaces between said circuits do not align with the spaces between said leads patterned in said first metal foil layer.

6. The process of claim 5 including the step of forming conductive vias to electrically interconnect said first and second metal foil layers.

7. The process of claim 6 wherein the step of forming said conductive vias comprises depositing copper by an electroless process.

8. The process of claim 6 wherein the step of forming said conductive vias comprises:
   (a) forming a carbon black dispersion on the walls of said vias; and
   (b) electrolytically depositing a conductive metal on said carbon black dispersion.

9. The process of claim 8 wherein said conductive metal is selected to be copper.

10. The process of claim 2 including selecting said first and second metal foil layers to be copper or a copper alloy having an electrical conductivity of about 100% IACS.

11. The process of claim 10 wherein said second metal foil layer is patterned into ground and power circuits.

12. The process of claim 11 wherein said ground and power circuits are patterned such that the spaces between said circuits do not align with the spaces between said leads patterned in said first metal foil layer.

13. The process of claim 12 including the step of forming conductive vias to electrically interconnect said first and second metal foil layers.

14. The process of claim 13 wherein the step of forming said conductive vias comprises depositing copper by an electroless process.

15. The process of claim 13 wherein the step of forming said conductive vias comprises:
   (a) forming a carbon black dispersion on the walls of said vias; and
   (b) electrolytically depositing a conductive metal on said carbon black dispersion.

16. The process of claim 15 wherein said conductive metal is selected to be copper.

17. The process of claim 2 wherein the said dielectric adhesive layer is sufficiently thick to prevent current leakage.

18. The process of claim 17 including selecting said dielectric adhesive to be an epoxy or a modified epoxy having a thickness of from about 0.0005 inches to about 0.001 inches.

* * * * *